United States Patent [19]

Ohshima et al.

[11] Patent Number: 5,007,028
[45] Date of Patent: Apr. 9, 1991

[54] MULTIPORT MEMORY WITH IMPROVED TIMING OF WORD LINE SELECTION

[75] Inventors: Shigeo Ohshima, Tokyo; Haruki Toda, Yokohama; Tatsuo Ikawa, Mitaka, all of Japan

[73] Assignee: Kabushiki Kaisha Toshiba, Kawasaki, Japan

[21] Appl. No.: 552,851

[22] Filed: Jul. 16, 1990

Related U.S. Application Data

[63] Continuation of Ser. No. 293,845, Jan. 5, 1989, abandoned.

[30] Foreign Application Priority Data

Jan. 19, 1988 [JP] Japan .................................. 63-8929

[51] Int. Cl.$^5$ .............................................. G11C 8/00
[52] U.S. Cl. ................................ 365/233; 365/230.05; 365/230.09
[58] Field of Search ............... 365/233, 230.05, 230.09, 365/221, 219

[56] References Cited

U.S. PATENT DOCUMENTS 4,633,411 12/1986 Ishimoto .......................... 365/230.09
4,720,819 1/1988 Pinkham et al. .

FOREIGN PATENT DOCUMENTS 121682 10/1984 European Pat. Off. .
188134 7/1986 European Pat. Off. .
248906 12/1987 European Pat. Off. .
249548 12/1987 European Pat. Off. .

*Primary Examiner*—Stuart N. Hecker
*Assistant Examiner*—Michael A. Whitfield
*Attorney, Agent, or Firm*—Finnegan, Henderson, Farabow, Garrett, and Dunner

[57] ABSTRACT

This invention provides a multiport memory including a storage section A having bit lines BL and $\overline{BL}$, a word line WL, a data transfer gate $\phi$DT, and a dynamic memory cell Cs, and a serial port B having a serial access function in a column direction of the storage section, wherein the memory includes a circuit for disabling a word line signal WL for selecting one word line under the conditions that a row address strobe signal $\overline{RAS}$ is raised in a transfer cycle in which data held by the memory cell is transferred to the serial port, and that the data transfer to the serial port is completed by the data transfer gate $\phi$DT.

18 Claims, 5 Drawing Sheets

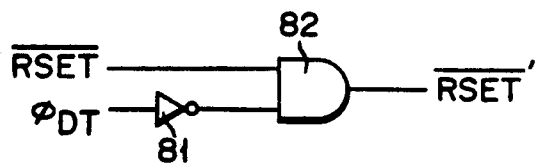
F I G. 1
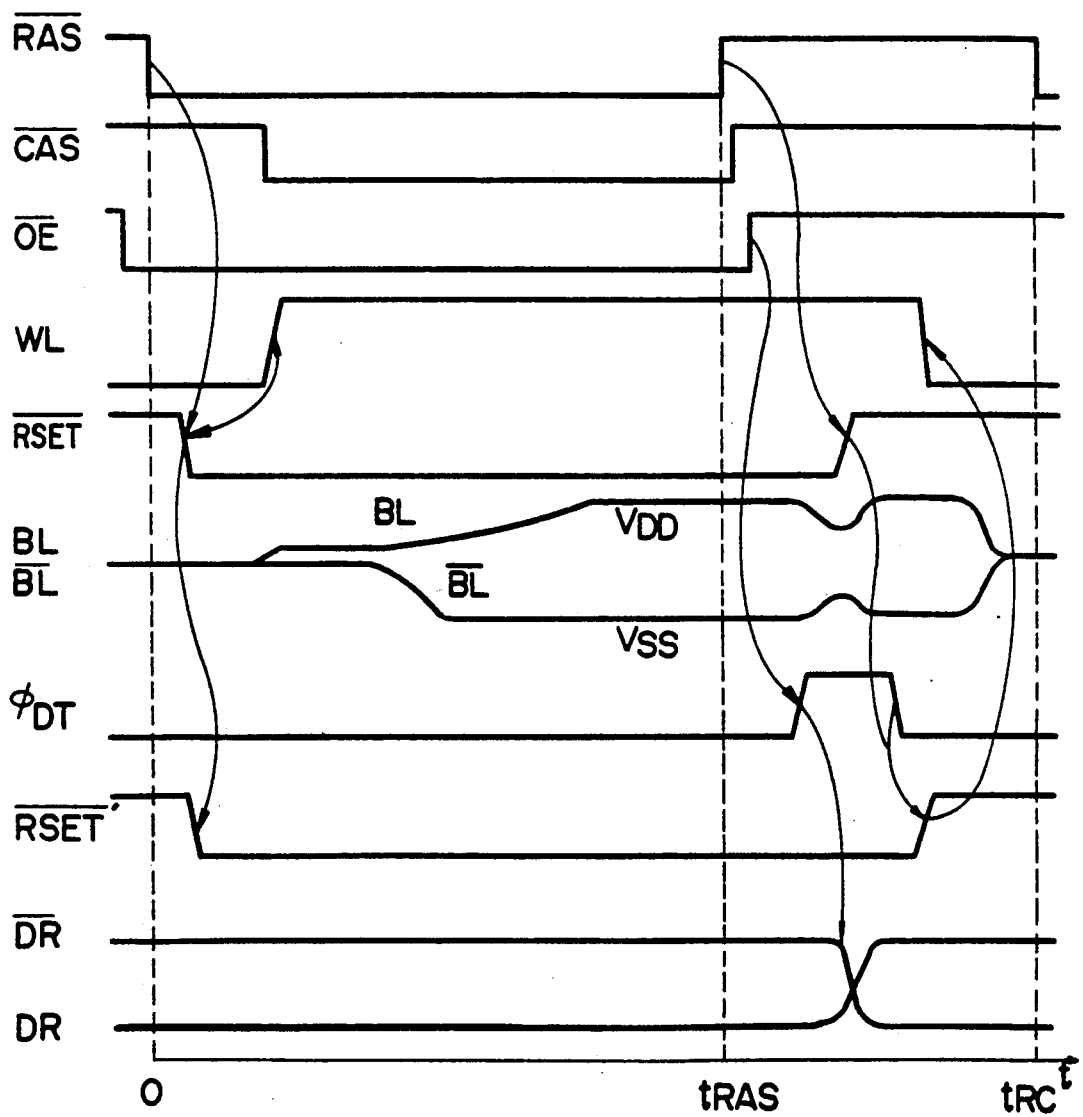
F I G. 2

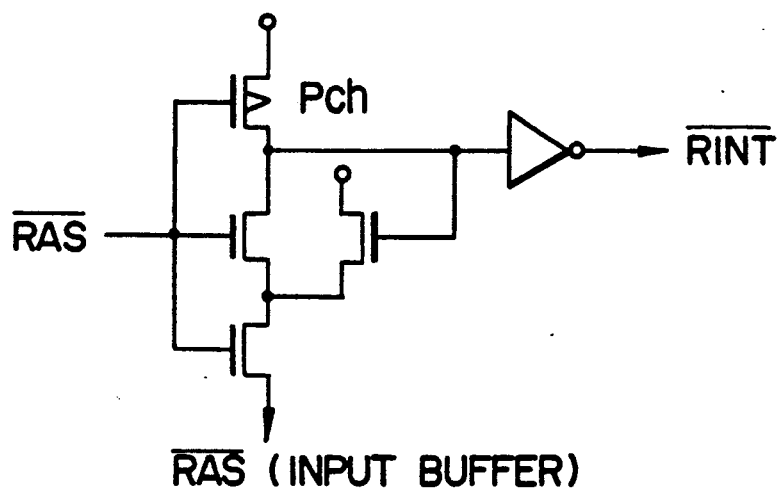
F I G. 6A
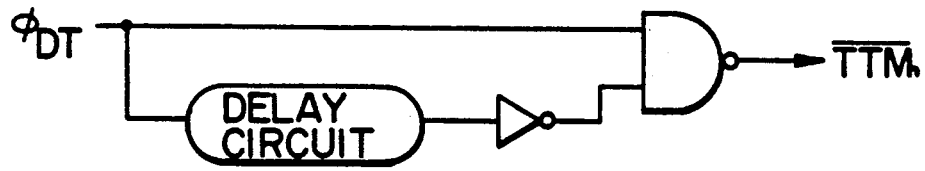
F I G. 6B
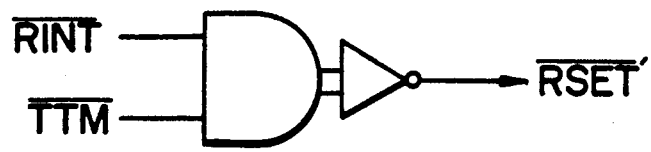
F I G. 6C

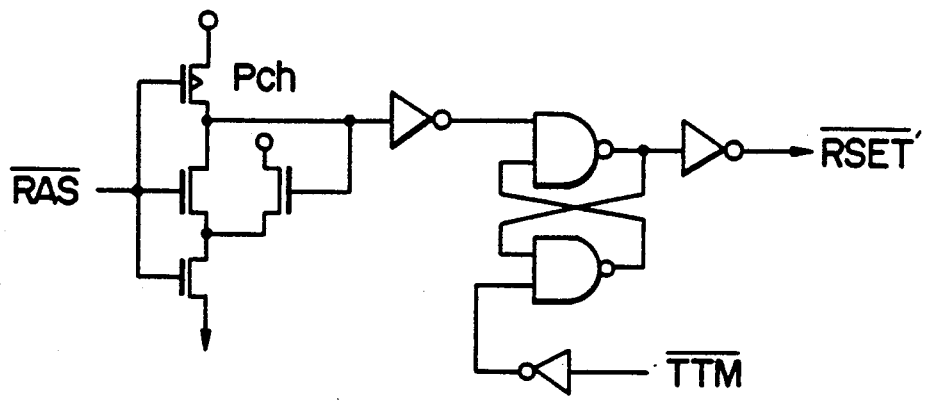
F I G. 7
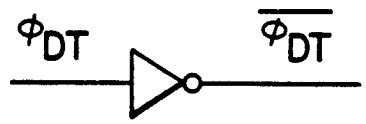
F I G. 8A
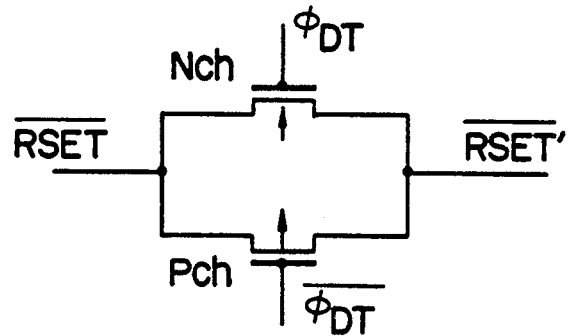
F I G. 8B
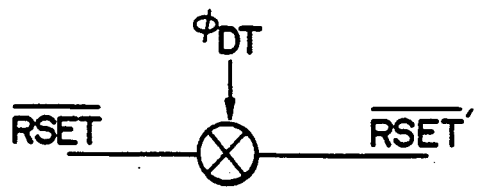
F I G. 9

MULTIPORT MEMORY WITH IMPROVED TIMING OF WORD LINE SELECTION

This application is a continuation of application Ser. No. 07/293,845, filed Jan. 5, 1989, now abandoned.

BACKGROUND OF THE INVENTION

1. Field of the Invention

The present invention relates to a multiport memory comprising a storage section having dynamic memory cells and a serial port in the column direction of the storage section and, more particularly, a multiport memory used for an improvement of a data transfer function for transferring data of the memory cells to the serial port.

2. Description of the Related Art

The multiport memory is a memory which has one serial access memory port for inputting/outputting data in the column direction, independently of an input/output of one random access memory port (to be referred to as a RAM port hereinafter) consisting of dynamic memory cells. Such multiport memories have already been commercially available.

FIG. 3 is a block diagram showing an arrangement of a multiport memory. The RAM port includes memory cell array 10 serving as a storage section, row address buffer 11, row address decoder 12, column address buffer 13, column address decoder and selector 14, and input/output data buffer 15. On the other hand, an SAM (serial access memory) port includes serial data register 30, serial address counter 40, serial decoder and selector 50, and serial input/output data buffer 60. The arrangement in FIG. 3 also includes data transfer gate 20 for performing bidirectional data transfer between the RAM port and the SAM port and timing generator 70 for generating timing signals from external input clock signals $\overline{RAS}$, e,ovs/CAS/ , e,ovs/WE/ , e,ovs/OE/ , e,ovs/SC/ , and e,ovs/SE/ . In consideration of an application of the multiport memory as a video memory, a dynamic memory cell having one transistor and one capacitor and a sense amplifier are suitable for memory cell array 10 in view of its integration density. For the sake of simplicity of the design, data transfer gate 20 consists of one MOSFET, and serial data register 30 consists of a flip flop circuit which is the same as in the memory cell of a static memory.

FIG. 4 shows a one-column arrangement of the above multiport memory. In FIG. 4, reference symbol A denotes a RAM port section; and B, an SAM port section. Reference symbol T1 denotes a switching transistor of the memory cell of the dynamic memory; CS, a storage capacitor thereof; WL, a word line; BL and e,ovs/BL/ , a pair of bit lines; N1, a data storage node; $\phi$DT, a data transfer gate signal; and DR and e,ovs/DR/ , storage nodes of the data register in the SAM port. Reference numeral 1 denotes a bit line sense amplifier of the RAM port; 2, MOSFETs constituting a data transfer gate; and 3, flip-flop circuits constituting a data register in the SAM port using the static memory cells.

FIG. 5 is a timing chart showing an operation according to the prior art in a data transfer cycle for supplying the memory cell data of RAM port A, i.e., the potential of node N1, to data register 3 in SAM port B. Although a precharge potential of the pair of bit lines BL and e,ovs/BL/ will be described by exemplifying the potential at ½ VDD level, this applies to other cases. A case wherein cell data stores "1", i.e., node N1 is set at supply voltage level VDD is considered.

An operation of timing generator 70 in FIG. 3 is started at a trailing edge of external input clock e,ovs/-RAS/ (row address strobe signal), and row address buffer 11 and decoder 12 are enabled, so that word line WL is selected and raised. Therefore, data of node N1 is read out on bit line BL. Sense amplifier 1 shown in FIG. 4 is enabled, and hence bit lines BL and e,ovs/BL/ are connected to VDD and ground VSS, respectively, thereby determining the potential of node N1. Then, transfer of data of RAM port A which is read out on this bit line BL to SAM port B is started at a leading edge of external input clock $\overline{OE}$ (output enable signal). In other words, a pulse of internal signal $\phi$DT (data transfer gate signal) is generated in response to the leading edge of clock $\overline{OE}$, and storage nodes DR and $\overline{DR}$ of the data register are connected to bit lines BL and $\overline{BL}$, respectively. As a result, data register 3 is updated so that lines DR and BL, and $\overline{DR}$ and $\overline{BL}$ are set at identical potentials.

On the other hand, when time tRAS has elapsed after signal RAS is disabled, signal $\overline{RAS}$ is raised again, and Internal signal $\overline{RSET}$ (word line reset signal) is raised in synchronism with the leading edge of signal RAS. Word line WL is reset and bit lines BL and $\overline{BL}$ are equalized (set at equal potentials), thus setting a standby state for the next cycle for the RAM port.

In such a data transfer method according to the prior art, internal signal $\overline{RSET}$ in the RAM port and data transfer gate signal $\phi$DT are asynchronous to cause the following disadvantages.

More specifically, as shown in FIG. 5, signal $\overline{OE}$ is raised after signal $\overline{RAS}$ is raised, and data transfer gate pulse $\phi$DT is generated. When data of RAM port A to be transferred is set at an inverted level of the data stored in data register 30, since power supply voltages VDD and VSS are instantaneously connected with each other, the potential of bit line BL is decreased by $\Delta V$. Therefore, when signal $\overline{RSET}$ is raised and word line WL is reset, a decreased "1" voltage appears at data storage node N1 of the memory cell, and a sufficient margin for holding data in a dynamic memory may not be assured. In addition, when the leading edge of signal $\overline{OE}$ is further delayed, word line WL is reset and the potential of bit line BL is set to be equal to that of bit line $\overline{BL}$. Therefore, the RAM port data to be transferred to the SAM port may be erased and an erroneous operation in the data transfer cycle may occur.

In order to solve the above problems by the prior art, the leading edge of signal $\overline{OE}$ in the data transfer cycle must be defined to be advanced from the leading edge of signal $\overline{RAS}$ in actual operation. Therefore, the margin of the timings of external input signal $\overline{RAS}$ and $\overline{OE}$ must be decreased, thereby interfering with an application technique of the multiport (dual port) memory.

SUMMARY OF THE INVENTION

It is an object of the present invention to solve the above problems, and to obtain a sufficient margin in setting of timings of row address strobe and output enable signals $\overline{RAS}$ and $\overline{OE}$ while data stored in a memory cell of a RAM port (storage section) during a data transfer cycle are held, thereby improving flexibility in an application technique of a multiport memory.

According to the present invention, there is provided a multiport memory including a storage section having dynamic memory cells and a serial port having a serial access function in the column direction of the storage section, comprising means for disabling word line signal WL for selecting one word line under the conditions that signal $\overline{RAS}$ is raised in a transfer cycle in which the data held in the memory cell is transferred to the serial port, and that data transfer to the serial port is completed in response to data transfer gate signal φDT.

More specifically, according to the present invention, conventional data transfer signal φDT which is not associated with the reset timing of the word line is detected and an AND gate is arranged. Then, the word line is reset after data transfer is completed, so that incomplete data may not be restored in the memory cell. In addition, a sufficient margin for rise timings of row address strobe and output enable signals $\overline{RAS}$ and $\overline{OE}$ can be assured.

BRIEF DESCRIPTION OF THE DRAWINGS

FIG. 1 is a circuit diagram showing a main part according to an embodiment of the present invention:

FIG. 2 is a timing chart showing an operation according to the embodiment in FIG. 1;

FIGS. 6(A), 6(B), and 6(C), FIG. 7, FIGS. 8(A) and 8(B), and FIG. 9 are circuit diagrams showing main parts according to other embodiments of the present invention.

DETAILED DESCRIPTION OF THE PREFERRED EMBODIMENT

Figure 3:
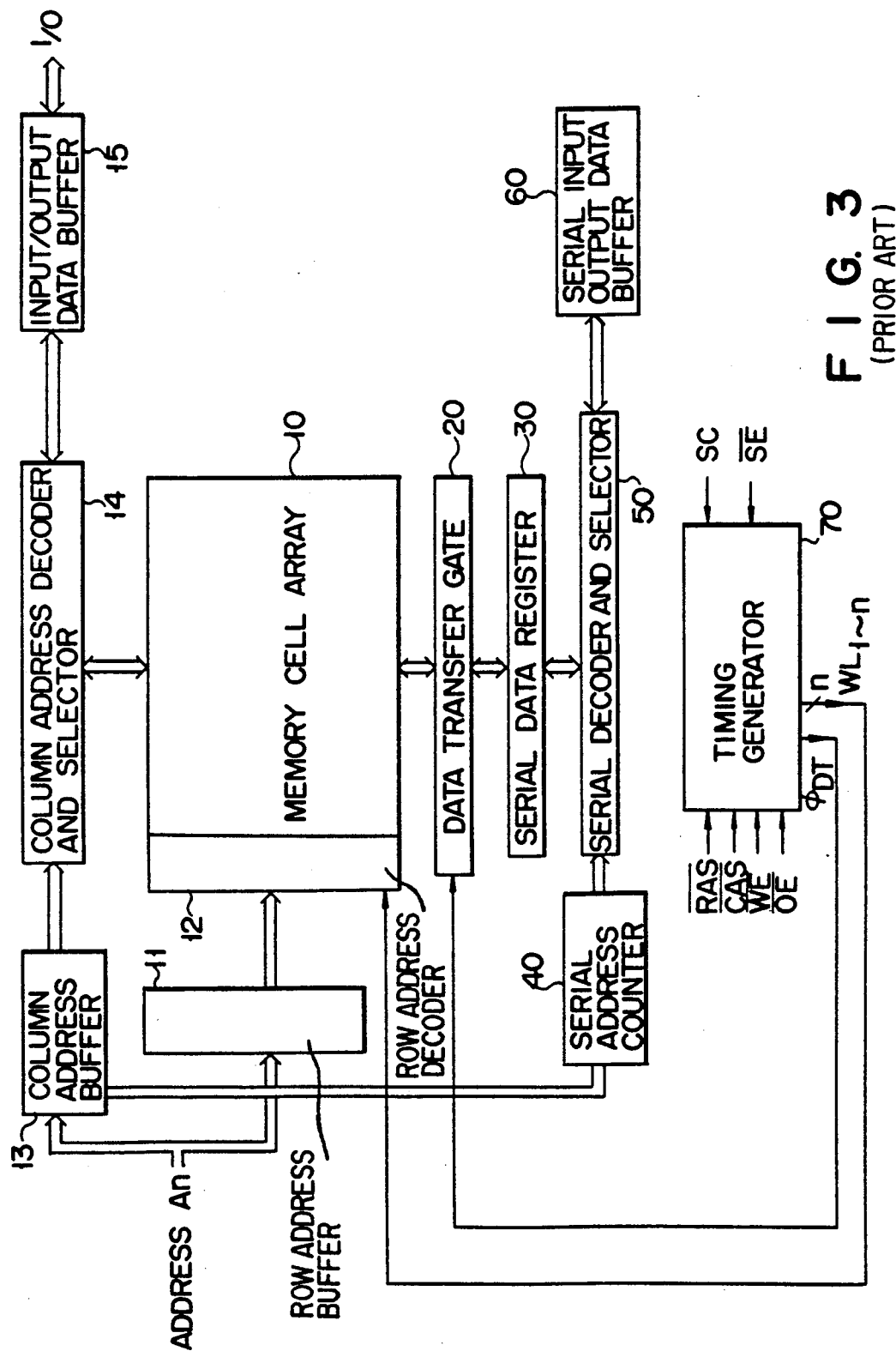
FIG. 3 is a block diagram showing an arrangement of a conventional multiport memory.
Figure 4:
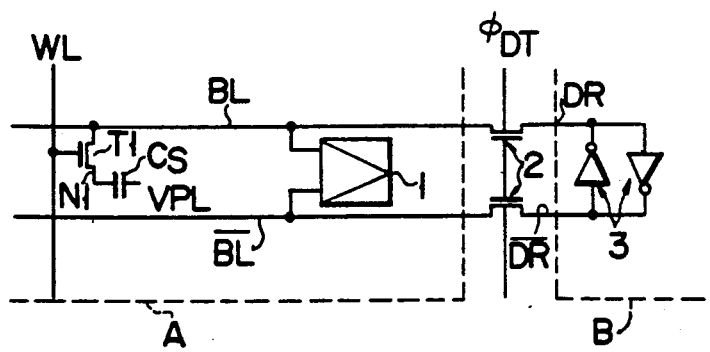
FIG. 4 is a circuit diagram showing a one-column arrangement of RAM and SAM ports in FIG. 3.
Figure 5:
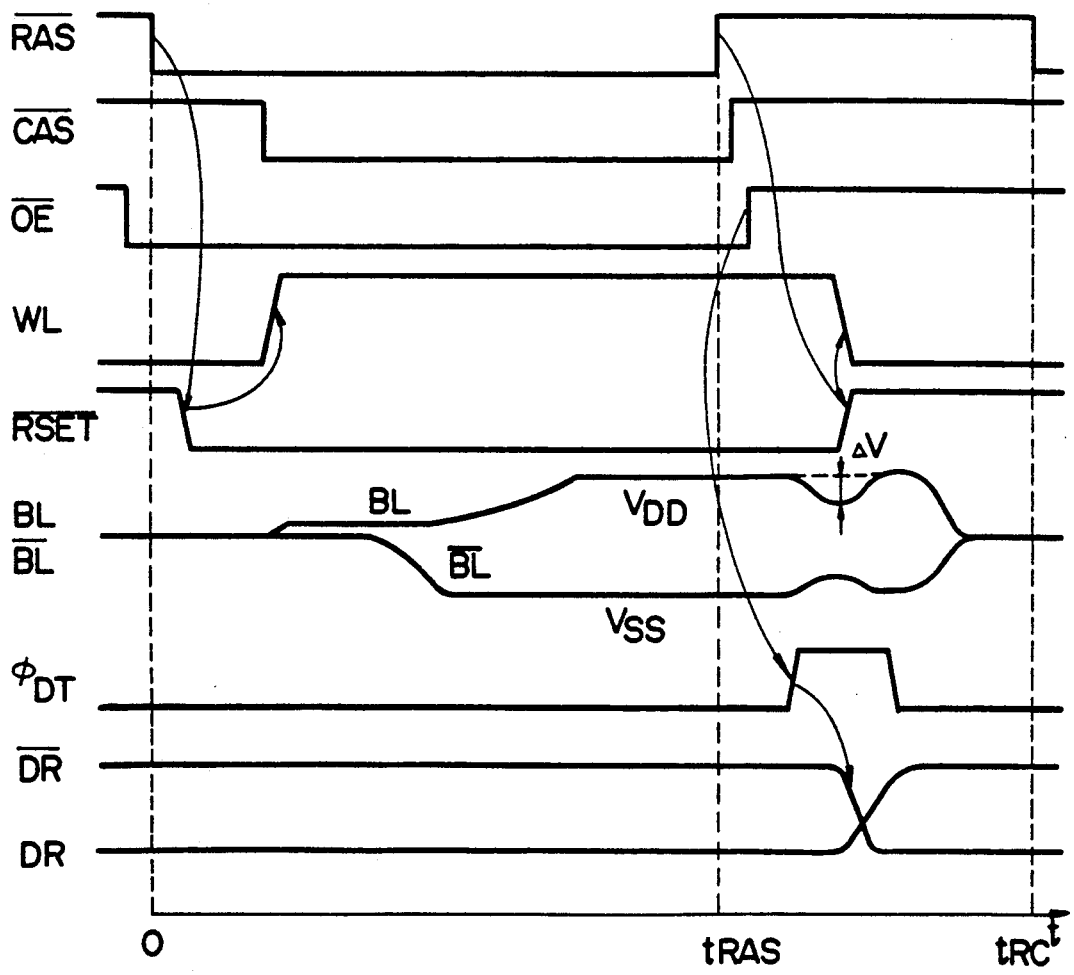
FIG. 5 is a timing chart showing a conventional operation of the arrangement in FIG. 4.

An embodiment of the present invention will be described below with reference to the accompanying drawings. FIG. 1 is a circuit diagram of a main part of the embodiment, and FIG. 2 is a timing chart of a data transfer cycle in the embodiment. The same reference symbols of nodes, signals, and the like denote the same parts as in the above-mentioned prior art. A feature of the present invention will be described below. That is, even if leading edge timings of row address strobe and output enable signals $\overline{RAS}$ and $\overline{OE}$ need not be considered, word line WL is reset when data transfer from RAM port A to SAM port B is completed, so that incomplete data obtained when the voltages of bit lines BL and $\overline{BL}$ are changed by ΔV advantageously need not be restored in memory cell Cs. For example, as shown in FIG. 1, word line reset signal $\overline{RSET'}$ is generated by AND gate 82 from RAM port internal signal $\overline{RSET}$ and a signal obtained by inverting data transfer gate signal φDT by inverter 81. Word line WL is reset after this signal $\overline{RSET'}$ is set at "1". In other words, there is provided a timeout function wherein the start signals of resetting of word line WL and potential equalization of bit lines BL and $\overline{BL}$ in the data transfer cycle are gated until generation of pulse φDT is completed.

According to this means, when the inverted level of the stored data in data register 3 is transferred from RAM port A, word line WL is reset after the potential of bit line BL is compensated. Therefore, the potential of data storage node N1 of memory cell Cs is not decreased to an incomplete "1" potential, and data holding characteristics of the memory cell which is equal to that in normal reading or writing cycle are assured. In addition, potentials of bit lines BL and $\overline{BL}$ are always equalized after the data transfer is completed, so that an erroneous operation of the data transfer performed the leading edge of signal $\overline{OE}$ is set after the leading edge of signal $\overline{RAS}$ may not occur, unlike in prior art.

Thus, a reset signal of word line WL in the RAM port is enabled under the condition that the data transfer is completed in response to data transfer gate signal φDT, so that the timings of the leading edges of signals $\overline{RAS}$ and $\overline{OE}$ in the data transfer cycle can be further freely set and a sufficient margin can be obtained for reliable data transfer and memory cell data holding.

At the same time, holding characteristics of the memory cell data which are substantially equal to those in normal reading or writing can be assured, and an operation during data transfer can be reliable.

FIGS. 6(A) to 6(C) are detailed circuit diagrams of a main part according to another embodiment of the present invention. FIG. 6(A) shows a typical Schmitt trigger circuit having a waveform forming function. FIG. 6(B) shows a circuit having a function as a differentiator of a data transfer gate signal. FIG. 6(C) shows an arrangement for generating an AND signal of outputs from the Schmitt trigger circuit and the differentiator. The resultant signal is used as a timing signal for resetting the word line, thereby achieving an object of the present invention.

FIG. 7 shows still another embodiment of the present invention in which Schmitt trigger and flip-flop circuits are used, and FIGS. 8(A) and 8(B) show still another embodiment in which an inverter and a MOS transistor are used. FIG. 9 shows still another embodiment when another switching circuit is used.

What is claimed is:
1. A multiport memory comprising:
a storage section including bit lines and a word line, respectively defining rows and columns, a data transfer gate, and a dynamic memory cell;
a serial port having a serial access function in a column direction of said storage section;
a word line signal for selecting a word line of said storage section; and
means for disabling said word line signal in response to a row address strobe signal and a data transfer gate signal at times when the row address strobe signal is raised in a transfer cycle in which data held by said memory cell is transferred to said serial port before the data transfer to said serial port is completed by said data transfer gate in response to the data transfer gate signal, wherein the word line signal is not disabled until the data transfer to said serial port is completed by said data transfer gate.

2. A memory according to claim 1, further comprising a timing generator for raising a data transfer gate signal at a leading edge of an output enable signal when the data held by said memory cell is transferred to said serial port.

3. A memory according to claim 1, wherein a data transfer gate signal is raised at a leading edge of an output enable signal when the data held by said memory cell is transferred to said serial port; and said disabling means includes a circuit for outputting a signal corresponding to the world line signal in accordance with an AND signal of a signal corresponding to the row address strobe signal and a signal corresponding to the data transfer gate signal.

4. A memory according to claim 1, wherein a data transfer gate signal is raised at a leading edge of an output enable signal when the data held by said memory cell is transferred to said serial port; and said disabling means includes waveform forming means for forming a waveform signal in response to the row address strobe signal, pulse generating means for generating a pulse signal in response to the data transfer gate signal, and a circuit for outputting a signal corresponding to the word line signal in accordance with an AND signal of the waveform signal and the pulse signal.

5. A memory according to claim 1, wherein a data transfer gate signal is raised at a leading edge of an output enable signal when the data held by said memory cell is transferred to said serial port; and said disabling means includes waveform forming means for forming a wave form signal in response to the row address strobe signal, pulse generating means for generating a pulse signal in response to the data transfer gate signal, and a flip-flop circuit responsive to the waveform signal and the pulse signal for outputting a signal corresponding to the word line signal.

6. A memory according to claim 1, wherein a data transfer gate signal is raised at a leading edge of an output enable signal when the data held by said memory cell is transferred to said serial port; and said disabling means enables or disables a signal corresponding to the row address strobe signal by a switching transistor for controlling a gate in response to the data transfer gate signal to output a signal corresponding to the word line signal.

7. A memory according to claim 1, wherein a data transfer gate signal is raised at a leading edge of an output enable signal when the data held by said memory cell is transferred to said serial port; and said disabling means comprises a circuit for switching a signal corresponding to the row address strobe signal in response to the data transfer gate signal to output a signal corresponding to the word line signal.

8. A memory according to claim 2, wherein said disabling means includes a circuit for outputting a signal corresponding to the world line signal in accordance with an AND signal of a signal corresponding to the row address strobe signal and a signal corresponding to the data transfer gate signal.

9. A memory according to claim 2, wherein said disabling means includes waveform forming means for forming a waveform signal in response to the row address strobe signal, pulse generating means for generating a pulse signal in response to the data transfer gate signal, and a circuit for outputting a signal corresponding to the word line signal in accordance with an AND signal of the waveform signal and the pulse signal.

10. A memory according to claim 2, wherein said disabling means includes waveform forming means for forming a waveform signal in response to the row address strobe signal, pulse generating means for generating a pulse signal in response to the data transfer gate signal, and a flip-flop circuit responsive to the waveform signal and the pulse signal for outputting a signal corresponding to the word line signal.

11. A memory according to claim 2, wherein said disabling means enables or disables a signal corresponding to the row address strobe signal by a switching transistor for controlling a gate in response to the data transfer gate signal to output a signal corresponding to the word line signal.

12. A memory according to claim 2, wherein said disabling means comprises a circuit for switching a signal corresponding to the row address strobe signal in response to the data transfer gate signal to output a signal corresponding to the word line signal.

13. A multiport memory comprising:
a memory cell array, including bit lines and word lines, respectively defining rows and columns of said array;
a row address buffer;
a row address decoder;
a column address buffer;
a column address decoder and selector;
an input/output data buffer;
a data transfer gate;
a serial data register;
a serial address counter;
a serial decoder and selector;
a serial input/output data buffer; and
a word line signal for selecting a word line of said memory cell array; and
a timing generator including means for disabling said word line signal in response to a row address strobe signal and a data transfer gate signal at times when the row address strobe signal is raised in a transfer cycle in which data held by said memory cell is transferred to said serial port before the data transfer to said serial port is completed by said data transfer gate in response tot he data transfer gate signal, wherein the word line signal is not disabled until the data transfer to said serial port is completed by said data transfer gate.

14. A memory according to claim 13, wherein the timing generator raises a data transfer gate signal at a leading edge of an output enable signal when the data held by said memory cell is transferred to said serial port; and said disabling means includes a circuit for outputting a signal corresponding to the world line signal in accordance with an AND signal of a signal corresponding to the row address strobe signal and a signal corresponding to the data transfer gate signal.

15. A memory according to claim 13, wherein the timing generator raises a data transfer gate signal at a leading edge of an output enable signal when the data held by said memory cell is transferred to said serial port; and said disabling means includes waveform forming means for forming a waveform signal in response to the row address strobe signal, pulse generating means for generating a pulse signal in response to the data transfer gate signal, and a circuit for outputting a signal corresponding to the word line signal in accordance with an AND signal of the waveform signal and the pulse signal.

16. A memory according to claim 13, wherein the timing generator raises a data transfer gate signal at a leading edge of an output enable signal when the data held by said memory cell is transferred to said serial port; and said disabling means includes waveform forming means for forming a waveform signal in response to the row address strobe signal, pulse generating means for generating a pulse signal in response to the data transfer gate signal, and a flip-flop circuit responsive to the waveform signal and the pulse signal for outputting a signal corresponding to the word line signal.

17. A memory according to claim 13, wherein the timing generator raises a data transfer gate signal at a leading edge of an output enable signal when the data held by said memory cell is transferred to said serial port; and said disabling means enables or disables a signal corresponding to the row address strobe signal by a switching transistor for controlling a gate in response to the data transfer gate signal to output a signal corresponding to the word line signal.

18. A memory according to claim 13, wherein the timing generator raises a data transfer gate signal at a leading edge of an output enable signal when the data held by said memory cell is transferred to said serial port; and said disabling means comprises a circuit for switching a signal corresponding to the row address strobe signal in response to the data transfer gate signal to output a signal corresponding to the word line signal.

* * * * *